United States Patent [19]
Krivokapic et al.

[11] Patent Number: 5,643,428
[45] Date of Patent: Jul. 1, 1997

[54] MULTIPLE TIER COLLIMATOR SYSTEM FOR ENHANCED STEP COVERAGE AND UNIFORMITY

[75] Inventors: Zoran Krivokapic, Santa Clara; David S. Bang, Palo Alto, both of Calif.

[73] Assignee: Advanced Micro Devices, Inc., Sunnyvale, Calif.

[21] Appl. No.: 382,366

[22] Filed: Feb. 1, 1995

[51] Int. Cl.$^6$ .................................................. C23C 14/34
[52] U.S. Cl. .................. 204/298.11; 204/192.12
[58] Field of Search ............. 204/192.12, 298.11

[56] References Cited

U.S. PATENT DOCUMENTS

| | | | |
|---|---|---|---|
| 4,046,359 | 9/1977 | Gellert | 259/193 |
| 4,238,685 | 12/1980 | Tischer | 21/263 |
| 4,824,544 | 4/1989 | Mikalesen et al. | 204/298.11 X |
| 4,988,424 | 1/1991 | Woodward et al. | 204/298.11 X |
| 5,223,108 | 6/1993 | Hurwitt | 204/192.12 |
| 5,330,628 | 7/1994 | Demaray et al. | 204/298.19 X |
| 5,344,352 | 9/1994 | Horne et al. | 204/192.15 X |
| 5,415,753 | 5/1995 | Hurwitt et al. | 204/192.12 |

FOREIGN PATENT DOCUMENTS

| | | | |
|---|---|---|---|
| 0440377A2 | 8/1991 | European Pat. Off. | H01J 37/34 |
| 0606745A1 | 7/1994 | European Pat. Off. | C23C 14/35 |
| 0682125A1 | 11/1995 | European Pat. Off. | C23C 14/34 |
| 405311419 | 11/1993 | Japan | 204/298.11 |
| 405326426 | 12/1993 | Japan | 204/298.11 |
| WO93/13542 | 7/1993 | WIPO | H01J 37/34 |

*Primary Examiner*—Nam Nguyen
*Attorney, Agent, or Firm*—Fliesler, Dubb, Meyer & Lovejoy LLP

[57] ABSTRACT

A collimator system for use in PVD sputtering of semiconductor wafers having multiple tiers provided between a target and wafer substrate. The collimator system prevents target atoms from contacting the wafer at substantially oblique angles, thereby providing good step coverage uniformity over the surface of the wafer. Additionally, the presence of more than one tier prevents localized build-up of target atoms that occurs in conventional single tier collimators, thereby providing good flat coverage uniformity over the surface of the wafer.

10 Claims, 7 Drawing Sheets

MULTIPLE TIER COLLIMATOR SYSTEM FOR ENHANCED STEP COVERAGE AND UNIFORMITY

CROSS REFERENCE TO RELATED SUBJECT MATTER

The present invention is related to currently pending U.S. application Ser. No. 08/316,090, pending, entitled "PVD SPUTTER SYSTEM HAVING NONPLANAR TARGET CONFIGURATION AND METHODS FOR OPERATING SAME" by Krivokapic et al., filed Sep. 30, 1994, which application is incorporated by reference herein in its entirety.

Additionally, the following publications are believed to be related to the present application and are cited here for purposes of reference:

(A) D. S. Bang. et al, "Modeling of Ti Physical Vapor Deposition Systems", IEEE International Workshop on Numerical Modeling of Processes and Devices for Integrated Circuits (NUPAD V, Honolulu) June 1994, pp 41–44;

(S) D. S. Bang. et al, "Profile Modeling of Collimated Ti Physical Vapor Deposition", 10th Symposium on Plasma Processing, Electro Chemical Society, San Francisco, May 1994; and (C) G. Box and N. Draper, "Empirical Model Building and Response Surfaces", John Wiley & Son, New York 1987.

BACKGROUND

1. Field of the Invention

The invention is generally directed to physical vapor deposition ("PVD") sputter systems. The invention is more specifically related to a multiple tier collimator system for use in PVD sputtering during the fabrication of semiconductor devices wherein it is desirable to obtain a combination of uniform deposition thickness, high deposition rate, and good step coverage.

2. Description of the Related Art

PVD sputtering is used within semiconductor processing and other arts for depositing metal films and the like onto substrate surfaces.

The substrate (e.g., a semiconductor wafer) is typically a planar disk that is positioned, face-down at the top of a vacuum plasma chamber.

A planar target is further typically positioned face-up within the chamber, in spaced apart and symmetrical counterfacing relation with the substrate. In older sputter systems the target was on top and the substrate on the bottom. The substrate-on-top versus on-bottom orientation relates to keeping the substrate surface clean and is not directly related to the present invention. For purposes of consistency, the older configuration with the substrate on the bottom will be shown, but it is to be understood that other orientations are fully within the contemplation of this invention.

The target is made of the material that is to be sputter deposited onto the substrate surface. Examples include, but are not limited to, metals such as aluminum (Al), titanium (Ti), copper (Cu) and alloys or compounds of these materials.

Fundamentally, PVD sputtering involves bombarding the surface of a target material to be deposited as the film with electrostatically accelerated argon ions. Generally, electric fields are used to accelerate ions in the plasma gas, causing them to impinge on the target surface. As a result of momentum transfer, atoms and electrons are dislodged from the target surface in an area known as the erosion region. The dislodged particles follow a generally linear trajectory from their point of emission on the target surface to a collision point on the counterfacing surface of the substrate. Physical adhesion mechanisms cause the target particles to bond to the surface of the substrate, thereby forming a film on the substrate.

The physical dimensions and positionings of the substrate and target play important roles in determining rate of deposition and the uniformity of the deposited film. The distribution of emission-inducing energy across the target also plays a role.

Ideally, the target should be very wide relative to the substrate so that the target represents an infinite source plane to the particle-receiving face of the substrate. In a such a situation, if the particle receiving face of the substrate is perfectly planar and parallel to the target, every point on the substrate receiving face will receive the same contribution of deposition particles and film thickness will be uniform across the entire substrate.

Unfortunately this ideal arrangement is not possible in practical implementations of PVD sputter chambers. The target has a finite size that is usually the same order of magnitude as that of the substrate. Non-uniformities develop across the substrate for characteristics such as deposition film thickness and deposition rate due to boundary conditions. Non-uniformities in the substrate may also result from non-uniform target erosion.

In the fabrication of semiconductor devices, the substrate surface is Often not perfectly planar. Nonlinear features such as channels and mesas are typically found on the semiconductor substrate. It is often desirable to coat the sidewalls and/or bottoms of each channel or mesa with a layer of deposition material having a prescribed thickness. However, the linear nature of the trajectories followed by the emitted target particles in PVD systems create shadow effects. Not every portion of the substrate surface receives the same amount of target material at the same rate in the case where the substrate surface includes nonlinearities such as channels or mesas.

The term, "channel" is used herein in a broad sense to include features in semiconductor devices and the like such as contact vias, trenches and other depressions which are to be fully or partially filled with deposition material. A channel 12 in wafer 10 is shown on FIGS. 1–3.

The term, "mesa" is similarly used herein in a broad sense to include any device feature rising above a surrounding plane where the feature and/or its surrounding plane are to be coated with deposition material. A mesa 14 in wafer 10 is shown on FIGS. 1–3.

The term, "step coverage" is used herein in a qualitative sense to refer to the ability to coat one or more sidewalls or bottom of a channel or mesa to a desired thickness. The term, "step coverage" is further used herein in a quantitative sense to refer to the ratio of film thickness at the bottom center or top center of a channel or mesa, respectively, relative to the general film thickness of the planar regions of the wafer.

The term, "step coverage uniformity" is used herein in a quantitative sense to mean the statistical standard deviation (sigma) of step coverage across a given substrate.

The term, "flat coverage uniformity" is used herein in a quantitative sense to mean the statistical standard deviation (sigma) of film thickness across a given substrate taking into consideration only substantially planar regions (not step regions) of the substrate surface.

The term, "bottom coverage uniformity" is used herein in a quantitative sense to mean the statistical standard deviation (sigma) of film thickness across a given substrate taking into consideration only regions at the bottom of channels or mesas.

It is desirable in PVD sputtering to control the path of the sputtered target atoms to travel substantially perpendicularly between the target and the wafer substrate. Perpendicular travel of the target atoms yields an optimal step coverage, i.e., the ratio of film thickness at the bottom or top of channel or mesa, respectively, to film thickness at the planar portions of the wafer. One conventional method of controlling the target atom path is by locating collimators within the field between the target and substrate wafer. A conventional collimator system 16 including a plurality of collimators is shown in FIG. 1 between a target 18 and a wafer 10. A collimator is preferably formed of a plurality of substantially planar surfaces of minimal thickness, which planar surfaces are provided perpendicular to the target and substrate surfaces. With such an orientation, target atoms travelling in substantially perpendicular paths will reach the substrate without contacting a collimator, but target atoms traveling along substantially oblique paths will contact the collimators and be blocked from reaching the wafer substrate.

A problem with conventional collimator systems is that, while providing good step coverage, they result in poor flat coverage uniformity across the wafer. As shown in FIGS. 2 and 3, a point $P_1$ located directly beneath a collimator receives target atoms from a greater surface area of the target, as compared to a point $P_2$ located between the collimators, because the point $P_1$ is subject to less blockage, or shadowing, by the collimators than is point $P_2$. Thus, as shown slightly exaggerated in FIG. 3 for clarity, the deposited film tends to have a greater thickness under the collimators than in areas between the collimators. Varying the dimensions of the collimators and distance between the collimator and wafer will vary the location of greatest concentration of target atoms, but areas of disproportionate concentration still occur.

If a desired minimum thickness is to be obtained at point $P_2$, for example, an excess amount of material needs to be deposited at $P_1$ in order to assure that the film thickness at $P_2$ will be adequate. This is disadvantageous because it wastes target material. The target is eroded faster than absolutely necessary and has to be replaced more often. The deposition of excess target material wastes time, energy, and increases the cost of production. Moreover, in some instances, the excess material near point $P_1$ has to be polished away or etched back in order to obtain uniform film thickness across the entire surface of the substrate. This also wastes time, energy and resources.

One solution to the problem of poor flat coverage uniformity with collimators is to increase the pressure within the sputtering chamber. Increasing the pressure causes a greater number of collisions between the target atoms as they approach the wafer, and thus the atoms scatter to a greater degree. Another solution to the problem of poor flat coverage uniformity with collimators is to increase the distance between the collimators and the wafer substrate. As with increased pressure, the greater distance allows more collisions and greater scattering of the target atoms. Additionally, increasing the distance between the collimators and wafer decreases the blockage or shadow effect that the collimators provide.

However, the problem with increasing the chamber pressure and/or increasing the distance between the collimator and substrate is that these solutions increase the incidence of target atoms contacting the substrate at oblique angles, thereby resulting in poor step coverage. Thus, the prior art solutions to poor flat coverage uniformity with collimators actually negate the purpose and advantages for which collimators are intended.

SUMMARY OF THE INVENTION

It is therefore an object of the invention to provide a collimator system for use in a sputter apparatus that provides an improved combination of flat coverage uniformity and step coverage uniformity.

It is a further object of the present invention to provide an improved collimator system that can be used with conventional PVD sputter systems.

It is a further object of the present invention to reduce wafer fabrication time, cost and waste of resources by providing a more efficient film deposition process.

These and other objects are accomplished by the present invention which relates to a multiple tier collimator system for use in PVD sputtering of semiconductor wafers. In one embodiment of the invention, first and second tiers of collimators are provided between a target and wafer substrate. The two tiers are preferably hexagonal from a top perspective, spaced from each other, and slightly staggered with respect to each other.

During a sputtering process, target atoms are dislodged from the target as result of charged ion particles contacting the surface of the target. The dislodged target atoms travel toward the wafer substrate in substantially linear paths. The collimator system according to the present invention prevents target atoms from contacting the wafer at substantially oblique angles, thereby providing good step coverage uniformity over the surface of the wafer. Additionally, the presence of more than one tier prevents the localized build-up of target atoms on the wafer that occurs in conventional single tier collimators, thereby providing good flat coverage uniformity over the surface of the wafer.

The dimensions of the particular collimator tiers and their orientation relative to each other and the wafer may be varied to optimize flat coverage uniformity, step coverage uniformity and film deposition rate. Additionally, the dimensions and relative orientations of the collimator tiers may be controlled to improve either flat coverage uniformity, step coverage uniformity or film deposition rate relative to the other properties.

BRIEF DESCRIPTION OF THE DRAWINGS

The below detailed description makes reference to the accompanying drawings, in which.

DETAILED DESCRIPTION

The invention will now be described with reference to FIGS. 4–9, which show various embodiments of a multiple tier collimator system. The collimator system of the present invention shall be described herein with regard to PVD sputtering of thin films onto semiconductor wafers. However, it is understood that the present invention relates specifically to the collimator system. Such a system may be used for sputtering films onto substrates other than semiconductor wafers. Moreover, it is understood that the collimator system according to the present invention may be used in various thin film deposition processes other than PVD sputtering.

Figure 1:
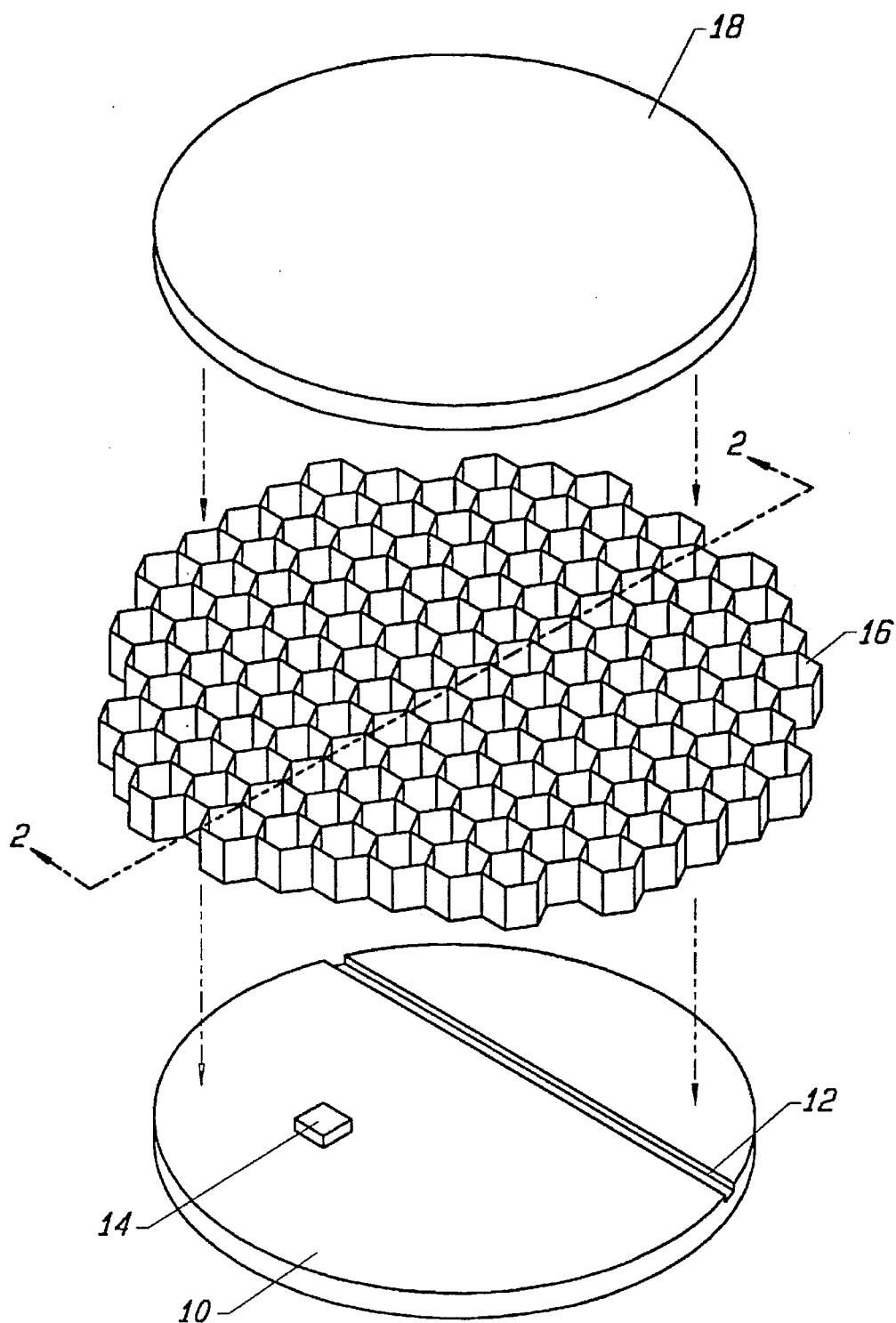
FIG. 1 is an exploded perspective view of a conventional collimator system between a target and wafer.
Figure 2:
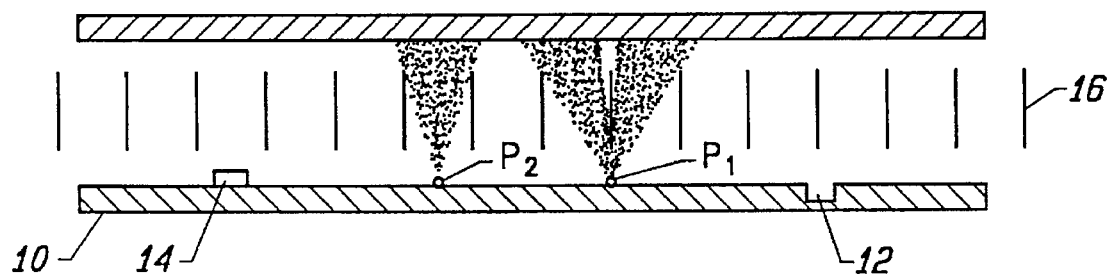
FIG. 2 is a cross-sectional view through FIG. 1 showing target atom paths from the target to the wafer.
Figure 3:
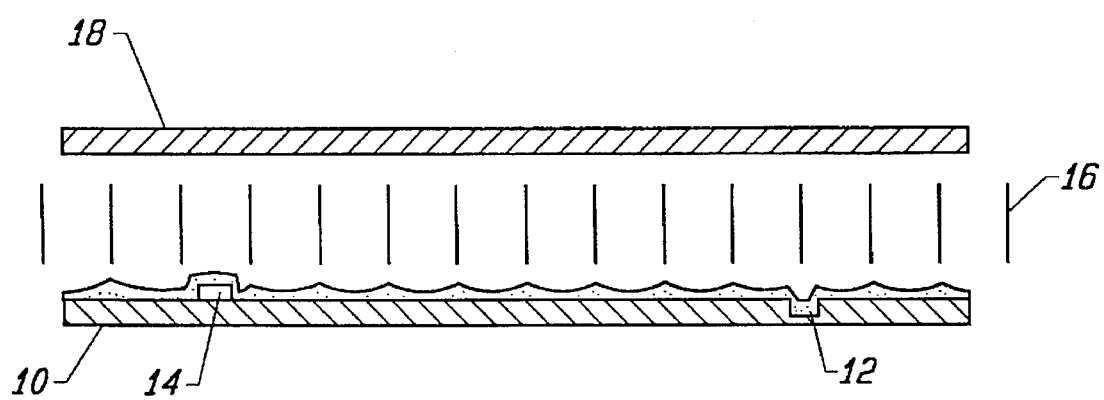
FIG. 3 is a cross-sectional view similar to FIG. 2 showing a profile of the film thickness deposition on the wafer.
Figure 4:
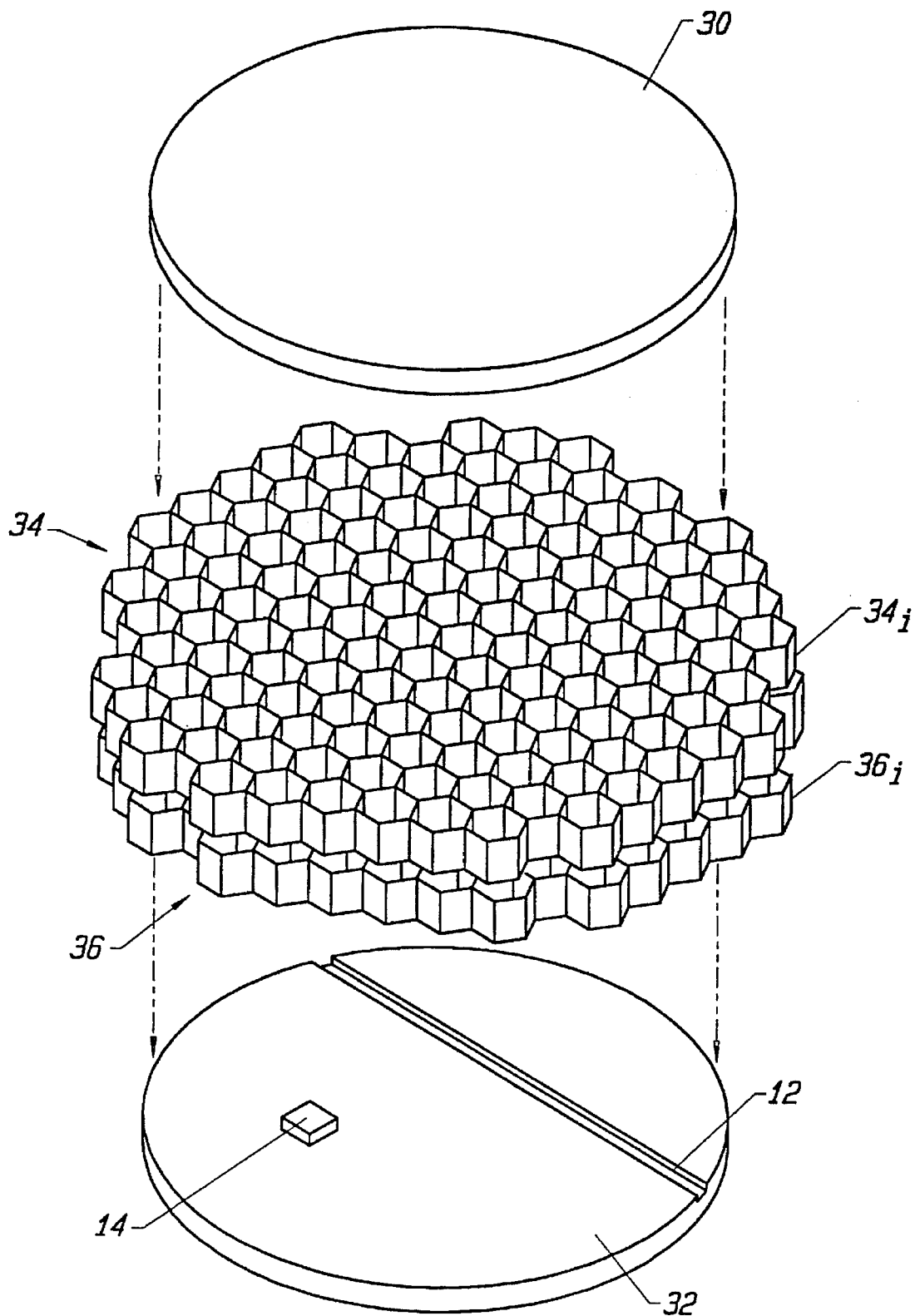
FIG. 4 is a perspective view of a multiple tier collimator system according to the present invention provided between a target and a wafer.
Figure 5:
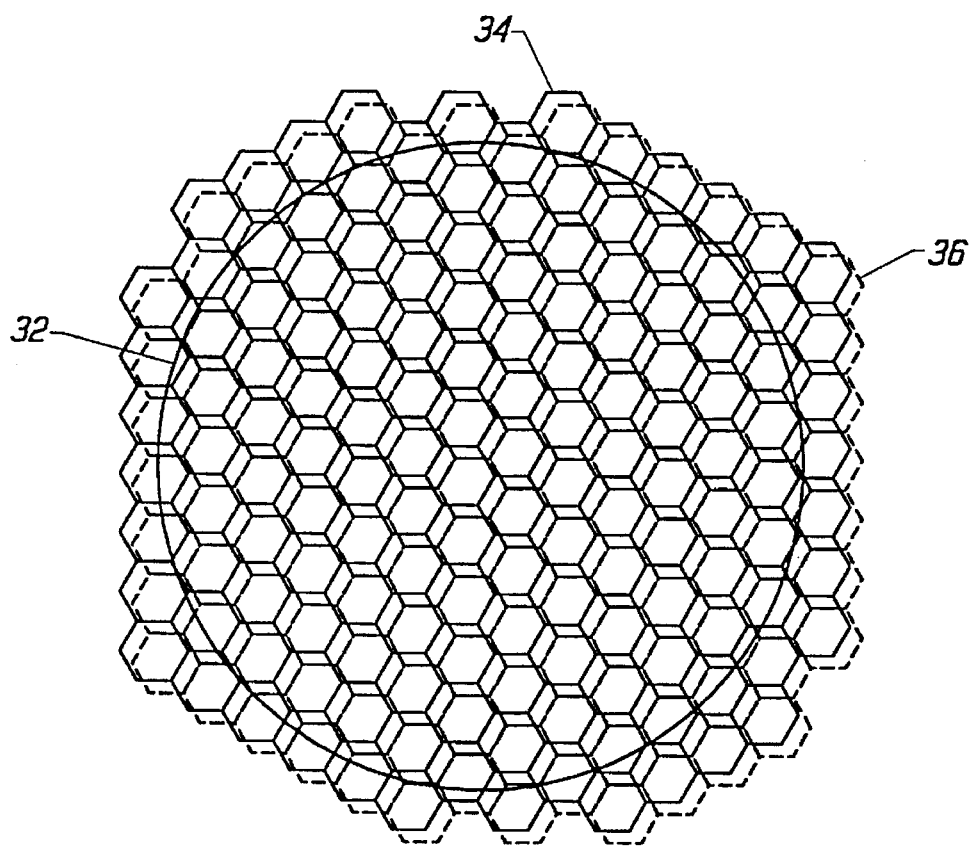
FIG. 5 is a top view of the multiple tier collimator system shown in FIG. 4.
Figure 6:
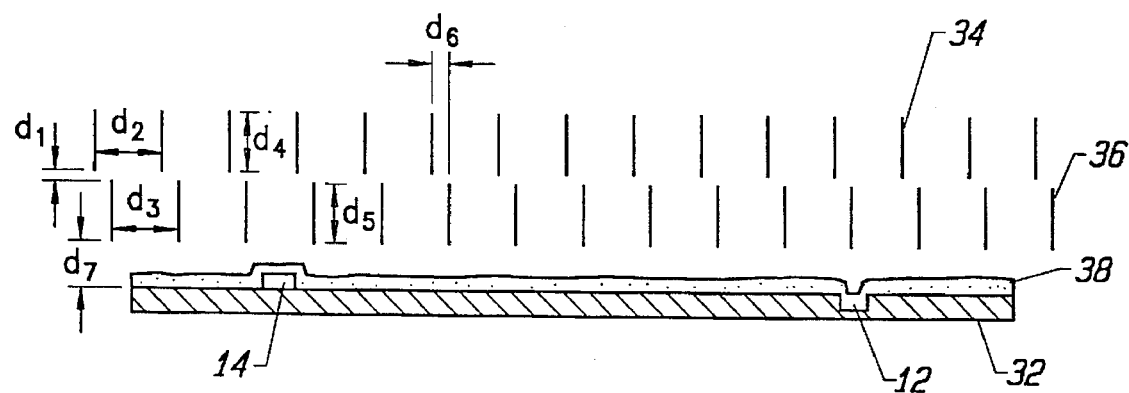
FIG. 6 is a side cross-sectional view of a multiple tier collimator system shown in FIG. 4.
Figure 7:
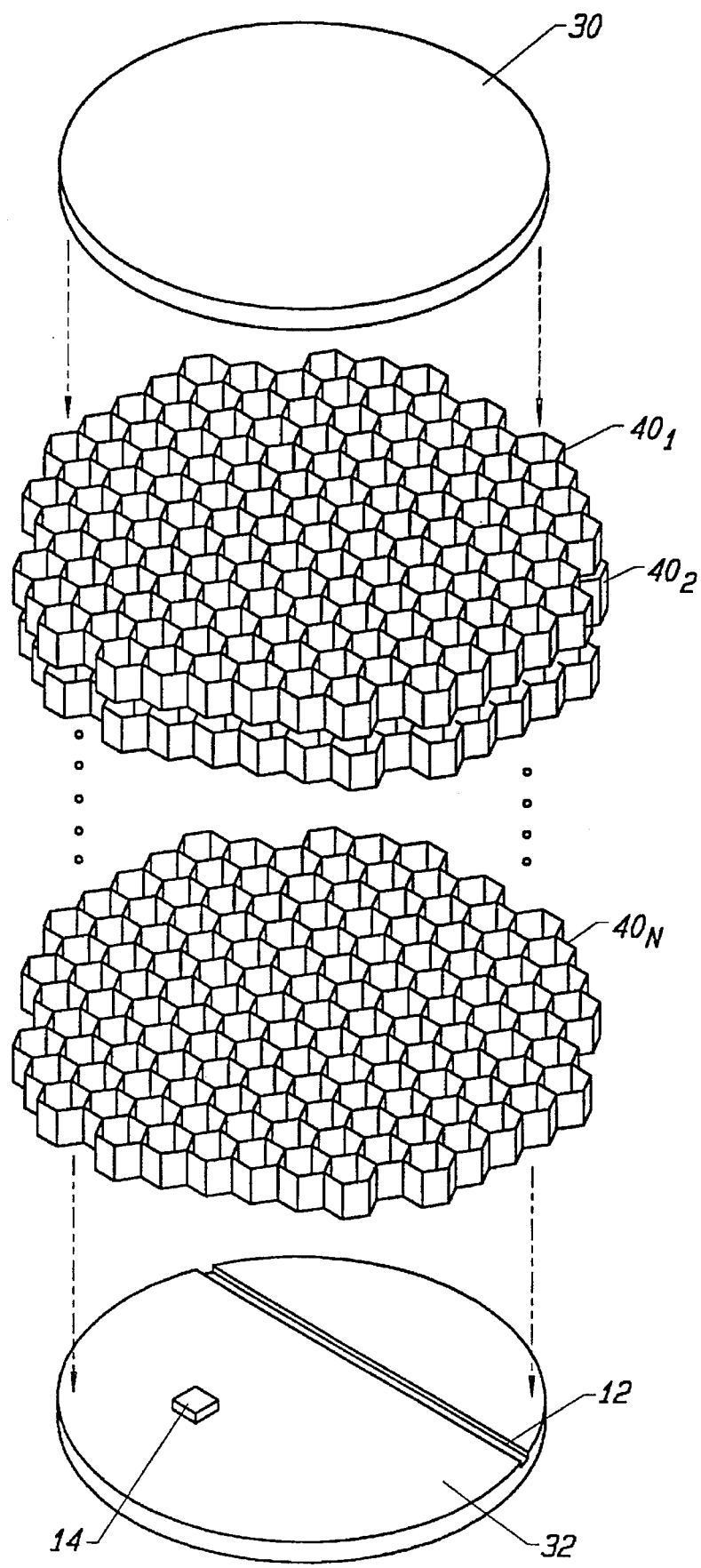
FIG. 7 is a perspective view of an alternative embodiment of the multiple tier collimator system according to the present invention.
Figure 8:
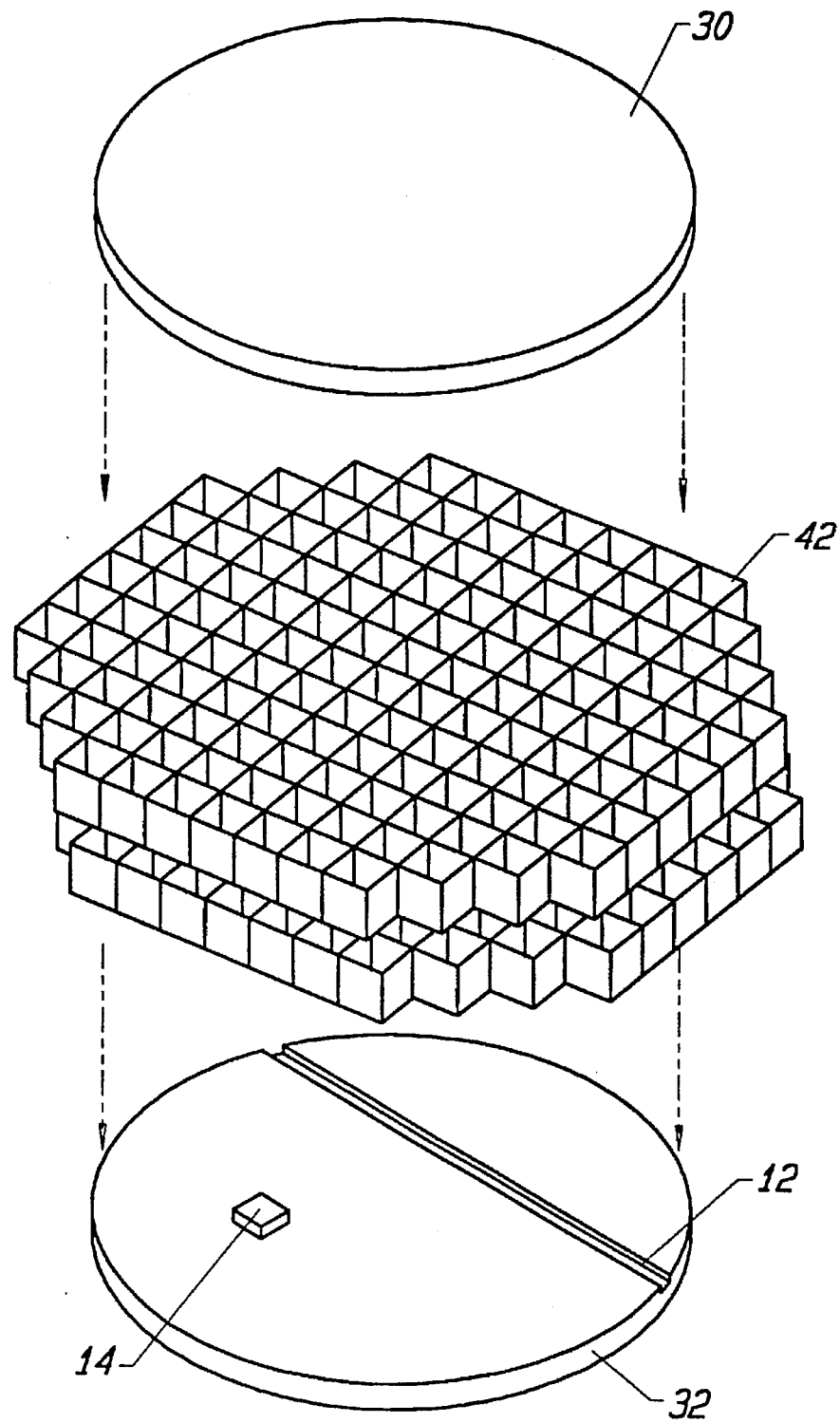
FIG. 8 is a perspective view of a further embodiment of a multiple tier collimator system according to the present invention.
Figure 9:
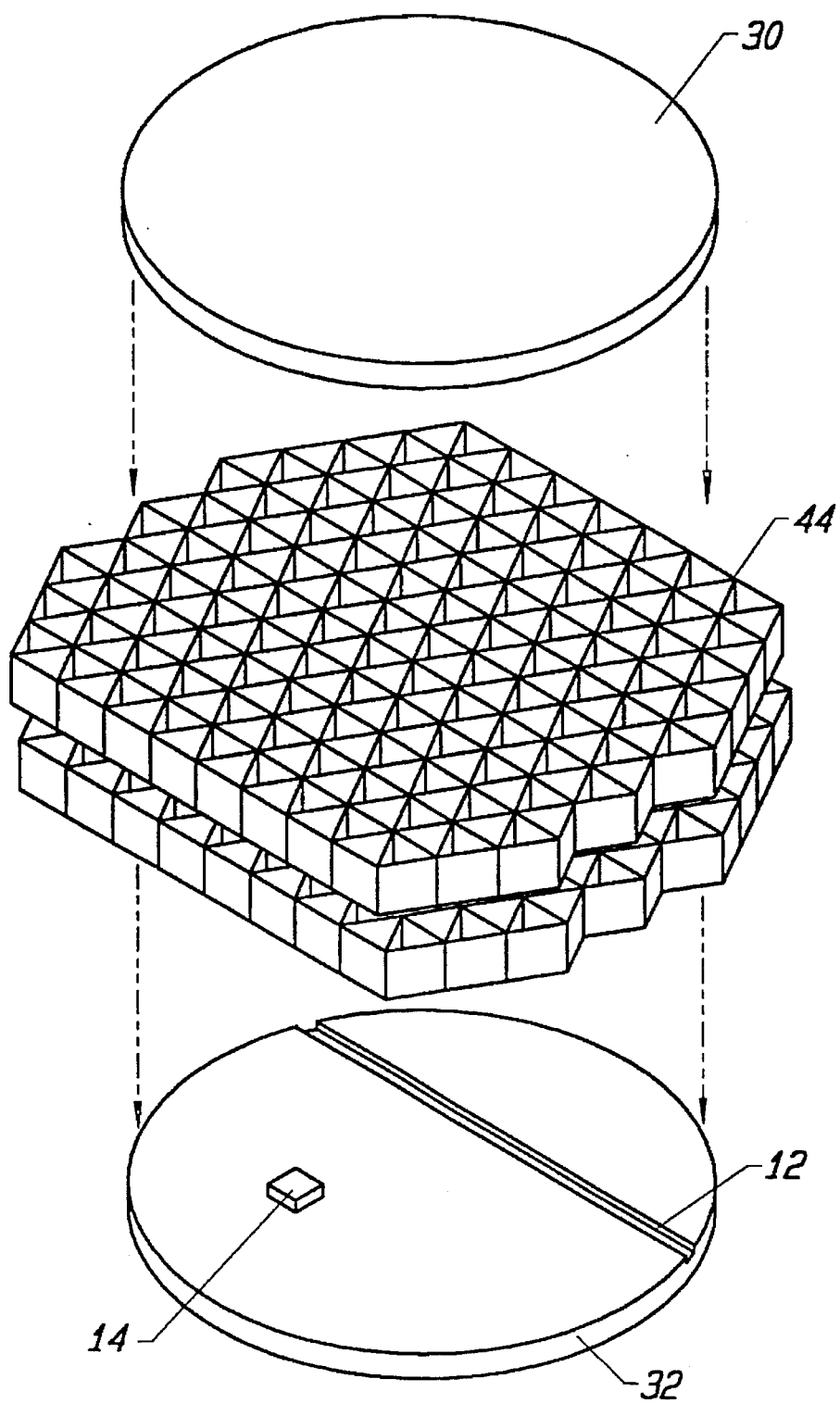
FIG. 9 is a perspective view of a further embodiment of a multiple tier collimator system according to the present invention.

Referring now to FIGS. 4–6, there is shown a collimator system of the present invention located between a target 30 and a wafer substrate 32. FIG. 5 is a top view looking down through the collimator system, and FIG. 6 is a cross-sectional side view through the collimator system. Although not critical to an understanding of the present invention, target 30 and wafer 32 are generally planar, disc-shaped members oriented generally parallel to and concentric with each other. Target 30 is generally of a substantially larger diameter and greater thickness than wafer 32. In one embodiment of the invention, target 30 has a diameter of approximately 300 mm and a thickness of approximately 20 mm. For a target of these dimensions, the wafer substrate may have a diameter of approximately 200 mm and a thickness of approximately 0.75 mm. It is understood that both the shape and size of the wafer 30 and target 32 may vary in alternative embodiments of the present invention. Although only two are shown in FIGS. 4–6, the surface of wafer 32 may include a number of channels 12 and mesas 14 thereon. Target 30 may be formed of various materials, including for example, metals such as aluminum (Al), titanium (Ti), copper (Cu) and alloys or compounds of these materials.

Emission-inducing energy is applied to the active face of the target 30 in the form of, for example, a plasma containing accelerated argon ions. A power source (not shown) may be coupled to the target 30 in order to provide the source of the accelerated argon ions. As is known in the art, confinement magnets (not shown) may also be provided adjacent the target for trapping the argon ions near the surface of the target, to thereby increase ion bombardment of the target.

As result of the ion bombardment of the target 30, target atoms are dislodged from the target and travel linearly away from the target, uniformly distributed about three-dimensional space. As previously described, it is desirable that those target atoms contacting the surface of wafer 32 travel along a substantially perpendicular path between the target and wafer 32. Target atoms traveling along a substantially oblique path will result in relatively poor step coverage uniformity across the surface of wafer 32.

In order to prevent target atoms traveling along a substantially oblique path from reaching target 32, the present invention includes a multiple tier collimator system including a first collimator tier 34 and a second collimator tier 36. Collimator tier 34 is comprised of a plurality of collimators $34_i$ and collimator tier 36 is comprised of a plurality of collimators $36_i$. In a preferred embodiment, a particular collimator $34_i$ is identical to each of the other collimators in tier 34 and is identical in configuration to each of the collimators $36_i$ in tier 36. It is understood however, that in alternative embodiments of the present invention, a collimator $34_i$ of collimator tier 34 may have a dissimilar size and/or configuration than other collimators $34_i$ of collimator tier 34. Additionally, a collimator $34_i$ of collimator tier 34 may have a dissimilar size and/or configuration than a collimator $36_i$ of collimator tier 36.

In order to ensure that the collimators are effective over the entire surface of wafer 32, collimator tiers 34 and 36 are preferably concentric with and larger than wafer 32. In one embodiment of the invention, collimator tiers 34 and 36 may have a radius that is roughly 3 inches greater than that of the wafer 32. Therefore, where the wafer has a diameter of approximately 200 mm, the collimator tiers 34 and 36 may have an approximate diameter of 300 mm. It is understood that the relative sizes of the collimator tiers and the wafer may vary in alternative embodiments provided that the collimator tiers are larger than the wafer.

Collimators $34_i$ and $36_i$ in one embodiment of the present invention have a hexagonal cross-section taken from a perspective perpendicular to the surface of wafer 32. The walls separating each of the collimators $34_i$ and $36_i$ are preferably as thin as possible, such as for example, 2 mm. In one embodiment of the invention, collimator tier 34 is separated from collimator tier 36 by a distance $d_1$ (FIG. 6) of 0.5 mm. In this embodiment, each of the six planner surfaces comprising a particular collimator $34_i$ in collimator tier 34 may have a width $d_2$ of 10 mm and a height $d_4$ of approximately 7 mm. Similarly, each of the six planer surfaces comprising a particular collimator $36_i$ of collimator tier 36 may have a width $d_3$ of 10 mm and a height $d_5$ of 7 mm.

As shown in FIG. 5, tier 34 and tier 36 are preferably overlapping but staggered with respect to each other taken from a perspective perpendicular to the surface of wafer 32. In one embodiment of the invention, tier 34 may be staggered by 25% with respect to tier 36. The 25% stagger is obtained by moving 25% up along a first, vertical portion of the hexagon and then 25% diagonally across a second, adjacent portion of the hexagon. Therefore, for the above-described dimensions, tier 34 will be offset from tier 36 by a distance $d_6$ (FIG. 6) equal to 2.5 mm. It is understood that the staggering of one tier with respect to the other my be lesser or greater than 25% in alternative embodiments.

In a preferred embodiment, the bottom collimator 36 may have a lower surface that is spaced a distance $d_7$ (FIG. 6) of approximately 20 mm away from the surface of wafer 32. While the distance between the target and the upper surface of collimator tier 34 is not as critical as the distance between the wafer 32 and the lower surface of collimator tier 36, the overall distance between target 30 and wafer 32 will affect the deposition rate for the process. Therefore, the distance between the target 30 and the wafer 32 preferably ranges between 50 mm and 100 mm, and the distance between target 30 and an upper surface of collimator tier 34 preferably ranges between 10 mm and 50 mm.

A multiple tier collimator system having the above described dimensions $d_1$ through $d_7$ has been found to yield a film deposition 38 having a particularly good combination of flat coverage uniformity and step coverage uniformity. As shown in FIG. 6, the thickness of film 38 across the surface of wafer 32 is relatively uniform. Moreover, as described in the Background of the Invention section, excess deposition of the target was necessary in conventional systems to ensure that each region of the wafer received at least a minimum required film thickness. By providing improved flat coverage uniformity, the collimator system according to the present invention makes more efficient use of a target by providing the required minimum film thickness across the entire surface of the wafer without excess film deposition and excess erosion of the target. Similarly, only minimal polishing or etching, if any, is required. Therefore, the present invention provides a saving in time, energy and resources.

It is further understood that each of the dimensions $d_1$ through $d_7$ may be varied in alternative embodiments of the invention, both absolutely and with respect to each other. Generally, the distance $d_1$ between collimator tier 34 and collimator tier 36 may vary from 0.5 mm to 5 mm; the width $d_2$ of a collimator $34_i$ and width $d_3$ of a collimator $36_i$ may vary from 5 mm to 20 mm; and the height $d_4$ of a collimator $34_i$ and height $d_5$ of a collimator $36_i$ may vary from 5 mm to 20 mm. The offset $d_6$ of collimator tier 34 from collimator tier 36 may vary from 0% to 50% of the width of a collimator $34_i$ or $36_i$, and a lower surface of collimator tier 36 may be located a distance $d_7$ away from wafer 32 that is between 10 mm and 50 mm.

Another consideration in providing the dimensions $d_1$ through $d_7$ is the rate of deposition of the target on the wafer. In general, as $d_2$ and $d_3$ increase, the deposition rate increases. As $d_4$ and $d_5$ increase, the deposition rate decreases. Therefore, along with step coverage uniformity and flat coverage uniformity, film deposition rate is also a factor relevant to determining the optimal dimensions for the collimators $34_i$ and $36_i$. The dimensions of the collimators $34_i$ and $36_i$ may be varied to emphasize either step coverage uniformity, flat coverage uniformity, or film deposition rate over the other properties.

Up to this point, the multiple tier collimator system according to the present invention has been described as having two tiers. However, as shown in the alternative embodiment of FIG. 7, the present invention may include collimator tiers $40_1, 40_2 \ldots$ up to $40_n$, where in a preferred embodiment n is no greater than 5. It is contemplated, however, that n may be greater than 5 in alternative embodiments. The length and width of each of the six planner surfaces comprising a collimator shown in FIG. 7 preferably has the same dimensional ranges as recited above for collimator tiers 34 and 36 described with regard to FIGS. 4–6. Similarly, the spacing between and the offset of adjacent tiers in FIG. 7 may have the same dimensional ranges as recited above for collimator tiers 34 and 36 described with regard to FIGS. 4–6. Finally, the lower tier $40_n$ may have a lower surface that is spaced from the wafer 32 over a range of distances similar to that recited with respect to $_7$ in FIG. 6.

It is further understood that the collimators comprising the collimator tiers may be formed of shapes other than hexagons. For example, FIG. 8 discloses a multiple tier collimator system similar to that shown in FIG. 4, with the exception that the shape of the individual collimators 42 are rectangular when viewed from a perspective perpendicular to the surface of wafer 32. Similarly, FIG. 9 discloses a multiple tier collimator system similar to that disclosed in FIG. 4, with the exception that collimators 44 are triangular when viewed from a perspective perpendicular to the surface of wafer 32. The dimensions of collimators 42 and 44 shown in FIGS. 8 and 9, and the relative orientation of the collimator tiers to each other and to wafer 32, may be similar to the dimensional ranges disclosed for collimators $34_i$ and $36_i$ described with regard to FIGS. 4–6. It is further understood that the collimator tiers according to the present invention may be comprised of various other geometric shapes when viewed from a perspective perpendicular to the surface of wafer 32. As a further example, a collimator tier may be comprised of a plate with a plurality of circular, or other geometric-shaped, openings formed in the plate. Moreover, it is contemplated that different collimator tiers within a single collimator system may be comprised of different geometric shapes and sizes.

The invention has been described thus far as including first and second collimating tiers residing in distinct, non-overlapping planes. However, in a further embodiment of the present invention, the collimator system my be comprised of a single tier of collimators having a first group of coplanar collimators interspersed with a second group of coplanar collimators, where the first and second groups reside in different but overlapping planes taken from a perspective parallel to the surface of wafer 32. It is further understood that more than two groups of collimators may be provided to reside in different but overlapping planes. Additionally, more than one tier of collimators may be provided where one or more of the tiers is comprised of groups of collimators that reside in different but overlapping planes.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the appended claims.

We claim:

1. A physical vapor deposition collimator system for preventing dislodged target particles from a target from contacting a surface of a substrate at substantially oblique angles, the collimator system comprising:

a first tier capable of being provided between the target and substrate, with said first tier provided substantially parallel to the surface of said substrate, said first tier including a plurality of collimators; and a second tier capable of being provided between the target and substrate, with said second tier provided adjacent and in fixed and constant relation to said first tier and being substantially parallel to said first tier, said second tier including a plurality of collimators;

wherein said first tier overlaps said second tier such that a collimator of said plurality of collimators from said first tier is staggered with respect to a closest collimator of said plurality of collimators from said second tier; and wherein said first and second tiers together cause the target particles to be deposited in a substantially flat layer with a substantially uniform film thickness on the surface of the substrate.

2. A physical vapor deposition collimator system as recited in claim 1, wherein the substrate comprises a semiconductor wafer.

3. A physical vapor deposition collimator system as recited in claim 1, wherein each collimator of said plurality of collimators from said first and second tiers have a hexagonal cross section.

4. A physical vapor deposition collimator system as recited in claim 1, wherein collimators of said plurality of collimators from said first and second tiers have a rectangular cross section.

5. A physical vapor deposition collimator system as recited in claim 1, wherein collimators of said plurality of collimators from said first and second tiers have a triangular cross section.

6. A physical vapor deposition collimator system for preventing dislodged target particles from a target from contacting a surface of a substrate at substantially oblique angles, the collimator system comprising:

a plurality of collimator tiers, each tier of said plurality of collimator tiers including a plurality of adjacent collimators, said each tier provided with major surfaces generally parallel to each other and capable of being provided parallel to the surface of the substrate, and said each tier overlapping each other tier from a perspective perpendicular to said major surfaces and said each tier being in a fixed and constant relation to each other tier;

wherein said each tier overlaps each other tier such that a collimator from a first tier of said plurality of tiers is staggered with respect to a closest collimator of a second tier of said plurality of tiers adjacent to said first tier; and wherein said first and second tiers together cause the target particles to be deposited in a substantially flat layer with a substantially uniform film thickness on the surface of the substrate.

7. A physical vapor deposition collimator system as recited in claim 6, wherein said plurality of tiers comprises greater than or equal to two tiers and less than or equal to two five tiers.

8. A physical vapor deposition collimator system as recited in claim 6, wherein said plurality of tiers comprises two tiers.

9. A physical vapor deposition collimator system as recited in claim 6, wherein collimators from said each tier have a rectangular cross section.

10. A physical vapor deposition collimator system as recited in claim 6, wherein collimators from said each tier have a triangular cross section.

* * * * *